United States Patent
Yogev et al.

(10) Patent No.: US 6,799,584 B2
(45) Date of Patent: Oct. 5, 2004

(54) CONDENSATION-BASED ENHANCEMENT OF PARTICLE REMOVAL BY SUCTION

(75) Inventors: David Yogev, Nesher (IL); Yoram Uzeil, Yodfat (IL); Lev Frisman, Zichron Ya'akov (IL); Amir Wachs, Haifa (IL)

(73) Assignee: Applied Materials, Inc., Santa Clara, CA (US)

( * ) Notice: Subject to any disclaimer, the term of this patent is extended or adjusted under 35 U.S.C. 154(b) by 60 days.

(21) Appl. No.: 10/035,972

(22) Filed: Nov. 9, 2001

(65) Prior Publication Data

US 2003/0091745 A1 May 15, 2003

(51) Int. Cl.⁷ .............................. B08B 3/08; B08B 5/04
(52) U.S. Cl. .............................. 134/1.3; 134/1; 134/21; 134/31; 134/34; 134/37; 134/902; 427/212; 427/240; 427/350; 427/422
(58) Field of Search .......................... 134/21, 33, 105, 134/157, 198, 902, 1.3, 31–34, 37; 427/294, 350, 421, 422, 240, 212, 215

(56) References Cited

U.S. PATENT DOCUMENTS

| | | | | |
|---|---|---|---|---|
| 4,132,567 A | * | 1/1979 | Blackwood | 134/1 |
| 5,024,968 A | * | 6/1991 | Engelsberg | 438/597 |
| 5,868,866 A | * | 2/1999 | Maekawa et al. | 134/34 |
| 6,021,785 A | * | 2/2000 | Grutzediek et al. | 134/1.3 |
| 6,059,893 A | * | 5/2000 | Kawasaki | 134/37 |
| 6,092,937 A | * | 7/2000 | Snodgrass et al. | 134/902 |
| 6,103,636 A | * | 8/2000 | Zahorik et al. | 436/745 |
| 6,146,469 A | * | 11/2000 | Toshima | 134/37 |
| 6,488,040 B1 | * | 12/2002 | de Larios et al. | 134/95.2 |

FOREIGN PATENT DOCUMENTS

| | | | | |
|---|---|---|---|---|
| JP | | 2-146733 A | * | 6/1990 |
| WO | WO 00/38935 A1 | | * | 7/2000 |

* cited by examiner

*Primary Examiner*—Kirsten C. Jolley
(74) *Attorney, Agent, or Firm*—Blakely Sokoloff Taylor & Zafman, LLP

(57) ABSTRACT

This invention is directed to apparatus and a method for removing particles from a surface, such as a semiconductor wafer. A fluid is applied to the surface on which the particles are distributed so as to coat the particles with the fluid. At least some of these particles have a dimension of less than approximately one micron. A suction force is applied in the vicinity of the surface after applying the fluid so as to remove from the surface the majority of those particles having the dimension of less than approximately one micron.

43 Claims, 3 Drawing Sheets

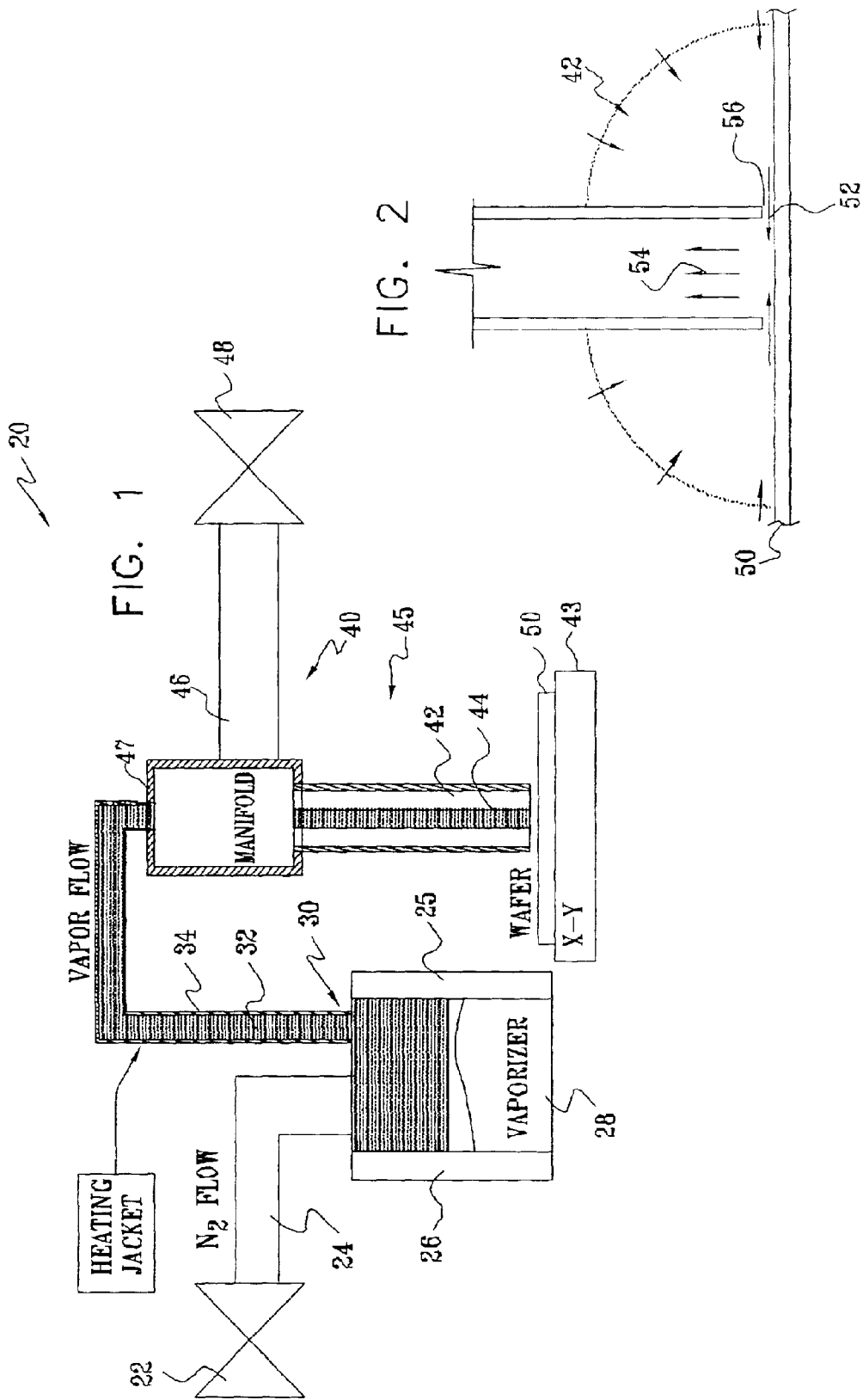

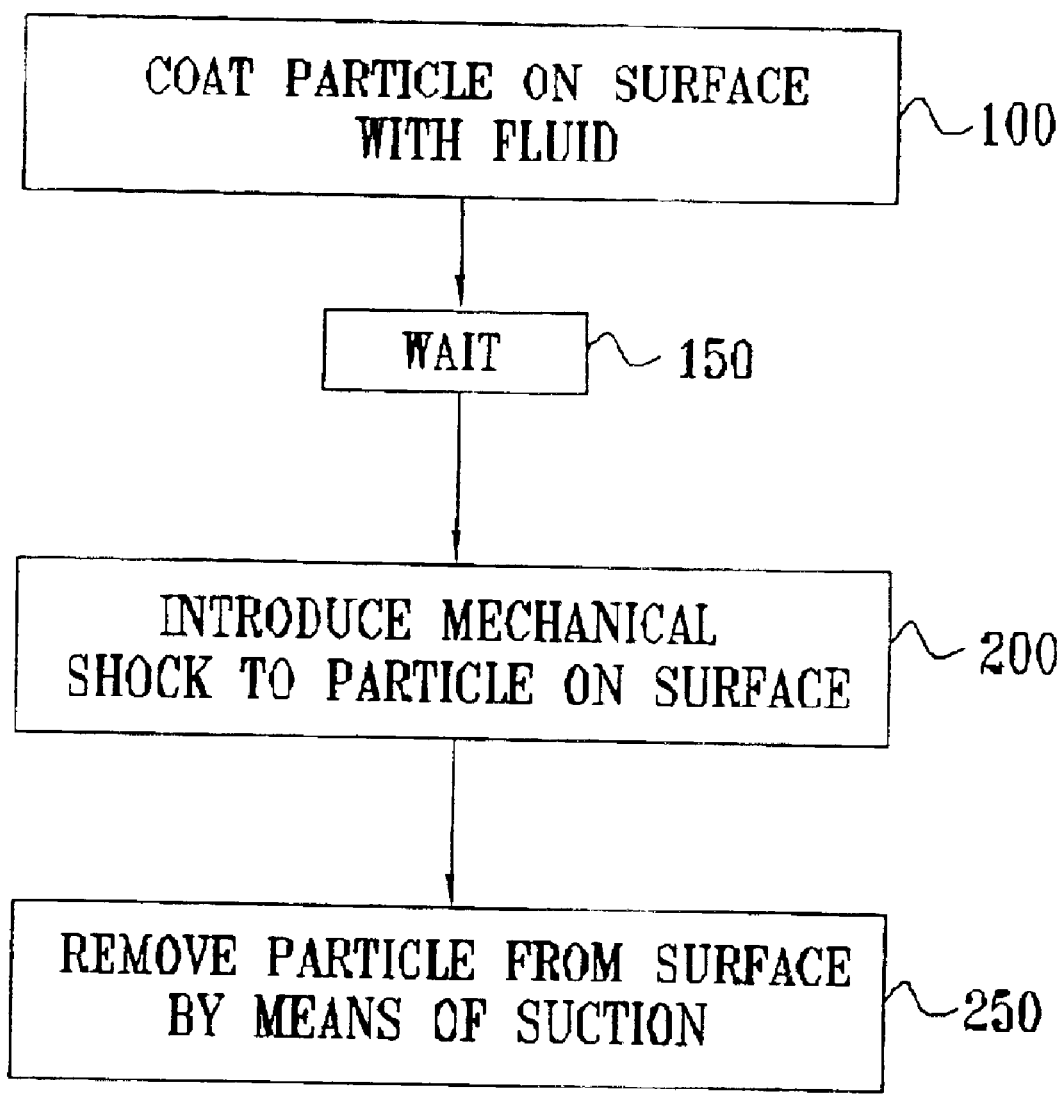

CONDENSATION-BASED ENHANCEMENT OF PARTICLE REMOVAL BY SUCTION

FIELD OF THE INVENTION

The present invention relates generally to processing of semiconductor devices, and specifically to methods and apparatus for removal of foreign particles and contaminants from solid-state surfaces.

BACKGROUND OF THE INVENTION

Removal of particles and contaminants from solid state surfaces is a major problem in integrated circuit manufacture. Integrated circuit manufacture includes, but is not limited to, production of semiconductor wafers, printed circuit boards, component packaging, and the like. As the trend to miniaturize electronic devices and components continues, and critical dimensions of circuit features become ever smaller, the presence of even a minute foreign particle on a substrate wafer during processing can cause a fatal defect in the circuit. Similar concerns affect other elements used in the manufacturing process, such as masks and reticules.

Various methods are known in the art for stripping and cleaning foreign matter from the surfaces of wafers and masks, while avoiding damage to the surfaces themselves. For example, U.S. Pat. No. 4,980,536 to Asch et. al. which is incorporated herein by reference, describes a method and apparatus for removal of particles from solid-state surfaces by laser bombardment. U.S. Pat. Nos. 5,099,557 and 5,024,968 to Engelsberg, which are also incorporated herein by reference, describe methods and apparatus for removing surface contaminants from a substrate by high-energy irradiation. The substrate is irradiated by a laser with sufficient energy to release the particles, while an inert gas flows across the wafer surface to carry away the released particles.

U.S. Pat. No. 4,987,286 to Allen, which is likewise incorporated herein by reference, describes a method and apparatus for removing minute particles (even sub-micron particles) from a surface to which they are adhered. An energy transfer medium, typically a fluid, is interposed between each particle to be removed and the surface. The medium is irradiated with laser energy, and absorbs sufficient energy to cause explosive evaporation, thereby dislodging the particles.

U.S. Pat. No. 5,023,424 to Vaught, which is incorporated herein by reference, describes a method and apparatus for using laser-induced shock waves to dislodge particles from a wafer surface. A particle detector is used to locate the positions of particles on the wafer surface. A laser beam is then focused at a point above the wafer surface near the position of each of the particles, in order to produce gas-borne shock waves with peak pressure gradients sufficient to dislodge and remove the particles. U.S. Pat. No. 5,023,424 further notes that immersion of the surface in a liquid (as in the above-mentioned U.S. Pat. No. 4,987,286, for example) is unsuitable for use in removing small numbers of microscopic particles.

Removal of small particles can also potentially damage the substrate. Generally, it has been found that sub-micron particles are the most difficult to detect and remove. Shock waves may cause these particles to explode by either splitting in a few pieces or to "splash" into a large number of fragments. There is a need to find a process which can be used to clean integrated circuits, without adding contaminants, without damaging the substrate surface upon explosion of a particle, and yet with removing particles, or fragments thereof, of different contaminants and of a large range of sizes.

SUMMARY OF THE INVENTION

It is an object of some aspects of the present invention to provide improved methods and apparatus for efficient removal of contaminants from solid-state surfaces.

It is a further object of some aspects of the present invention to provide improved methods and apparatus for removal of microscopic particles on semiconductor wafers and on other elements used in semiconductor device production.

In preferred embodiments of the present invention, a system for removing a particle from a solid-state surface, such as a semiconductor wafer, comprises a fluid delivery unit and a suction module. The fluid delivery unit deposits a fluid, preferably a vapor or a spray, onto the surface. Generally, the fluid condenses on particles on the surface, so that the overall size and mass of the particles with the liquid around them are much larger than they were before. When the suction module is actuated, a turbulent mass-transfer regime surrounding the particle induced by the suction force introduces a mechanical shock to the particle. The mechanical shock, coupled with the dissolution forces of the particle into the liquid phase, tends to release the particle from the surface. The suction force enables the particle and the liquid to be removed from the surface.

Thus, the inventors have found that wetting the surface prior to applying suction provides more effective removal of microscopic particles than does suction alone. This result contrasts with suction-based particle removal systems known in the art, in which suction is applied to a dry surface. While moisture may make it more difficult to remove large particles from the surface, it increases the effectiveness of the suction in mobilizing very small particles, particularly particles below approximately 1 micron, whose small size and mass makes it otherwise difficult to remove them.

In some preferred embodiments of the present invention the system is constructed such that the fluid is delivered in a channel and the suction forces remove the particle and fluid in another channel. The channels are typically constructed to be perpendicular to the solid-state surface. Preferably, the fluid is delivered in an inner channel, and the suction force is applied in an outer annular channel. Further preferably, the outer channel has a narrow gap (radius of outer channel less radius of inner channel) of less than 1 mm, and most preferably of around 0.3 mm. The nozzle edge of both of the channels is placed approximately 0.1–0.5 mm above the solid-state surface, and most preferably about 0.2 mm above the solid-state surface.

In further preferred embodiments of the present invention the system is constructed with a vaporizer which vaporizes the fluid phase. Typically, the vaporizer comprises at least one heating element, which is configured to heat both the fluid delivery channel and suction channel concomitantly.

In preferred embodiments of the present invention, improved methods and apparatus are provided for particle removal from a surface in which the fluid phase comprises water, or water vapor. The fluid phase is typically heated to 30–80° C. When the heated fluid impacts on the solid-state surface, some or all of the fluid molecules condense on the surface.

In some aspects of preferred embodiments of the present invention, a method and system are provided for delivering the fluid phase to the solid-state surface, wherein the delivery of the fluid phase is stopped and a suction force for particle removal is applied after waiting for a time period. This has been shown experimentally to be the most effective regime for particle removal.

In further preferred embodiments of the present invention, a turbulent flow regime is introduced by means of a combination of the fluid flow and the suction forces. The flow regime at solid-state surface is such that the horizontal fluid velocity immediately above the surface and parallel thereto is at least 100 m/s and is preferably around the speed of sound (around 330 m/s). The flow regime above the surface substantially reduces or eliminates boundary layer phenomena, stagnation and laminar flow phenomena.

In some other aspects of preferred embodiments of the present invention, the system is integrated with a laser cleaning tool. The tool is typically configured to apply laser energy to the surface so as to aid in the release of the particles from the surface. The inventors have also found that condensation-based suction is effective in removing most of the particles that tend to explode during the laser cleaning process, and thus, it is useful to integrate these two methods (suction cleaning and laser cleaning).

In some aspects of preferred embodiments of the present invention, a method and system are provided for delivering the fluid phase so as to substantially reduce or eliminate particle explosion phenomena. The need, in turn, to remove particle fragments is thus reduced or eliminated. Thus, this system provides efficient particle removal, substantially without damage to the wafer or other solid-state surface.

There is thus provided in accordance with a preferred embodiment of the present invention a method for removing particles from a surface, including:
  applying a fluid to the surface on which the particles are distributed, wherein at least some of the particles have a dimension of less than approximately one micron, so as to coat the particles with the fluid, and
  applying a suction force in a vicinity of the surface after applying the fluid so as to remove from the surface a majority of the at least some of the particles having the dimension of less than approximately one micron.

Preferably, the fluid includes water. Further preferably, applying the fluid includes using a carrier gas to convey the fluid to the surface. Additionally, applying the fluid preferably includes heating the fluid that is applied to the surface. Further preferably, heating the fluid includes heating the fluid to 30–80° C.

In a preferred embodiment, applying the suction force includes waiting for a predetermined time period following applying the fluid before applying the suction force. Preferably, the time period is in the range of 0.01 to 2 seconds. Further preferably, applying the fluid includes applying the fluid through a channel held approximately perpendicularly to the surface.

In a preferred embodiment, applying the suction force includes applying the suction force through an annular channel surrounding the channel through which the fluid is applied. Further preferably, applying the suction force further includes heating the annular channel and the fluid delivery channel. Yet further preferably, applying the suction force includes applying the suction force through a channel held at a tilt of 1–40 degrees from a perpendicular angle to the surface.

In another preferred embodiment, applying the suction includes applying the suction so as to generate a turbulent flow regime at the surface. Preferably applying the suction force includes applying the suction force for a period of time between 0.1 and 10 seconds. Further preferably, at least some of the particles removed have a dimension less than 0.2 micron.

In yet another preferred embodiment, applying the suction includes removing the particles via a nozzle having an aperture of less than 10 mm. Preferably, the aperture is between 0.5 and 5 mm. Further preferably, the nozzle is placed approximately 0.1–0.5 mm above the surface.

In a preferred embodiment, the surface is the surface of a semiconductor wafer.

There is thus provided in accordance with another preferred embodiment of the present invention a method for removing particles from a surface, including:
  applying a fluid to the surface on which the particles are distributed so as to coat the particles with the fluid, and
  applying a suction force in a vicinity of the surface after applying the fluid so as to generate a horizontal flow velocity of the fluid of at least 100 m/s, thereby removing at least some of the particles.

Preferably, the particles have a dimension of less than one micron.

There is thus provided in accordance with another preferred embodiment of the present invention a method for removing particles from a surface, including:
  applying a fluid to the surface on which the particles are distributed, including particles having a dimension of less than approximately one micron, so as to coat the particles with the fluid, and
  applying a suction force in a vicinity of the surface after applying the fluid so as to generate a horizontal flow velocity of the fluid of at least 100 m/s, thereby removing at least some of the particles have the dimension of less than approximately one micron.

Preferably, the horizontal flow velocity is in a range of a speed of sound.

There is thus provided in accordance with another preferred embodiment of the present invention, a method of removing a particle from a surface, including:
  applying a fluid to the surface so as to coat the particle,
  applying a laser beam to the surface such that absorption of the beam at the surface releases the coated particle from the surface substantially without causing the particle to explode, and
  removing the released particle and the fluid from the surface by means of a suction force.

There is thus provided in accordance with a preferred embodiment of the present invention, apparatus for removal of particles from a surface, including:
  a fluid delivery unit adapted to apply a fluid to the surface on which the particles are distributed, wherein at least some of the particles have a dimension of less than one approximately micron, so as to coat the particles with the fluid, and
  a suction unit constructed to apply a suction force to the surface after applying the fluid so as to remove from the surface a majority of the at least some of the particles having the dimension of less than approximately one micron.

Preferably, the apparatus includes a vaporizer, which includes a heating element configured to heat the fluid before it is applied to the surface. Further preferably, the heating element is further configured to heat the particle and fluid during their removal from the surface by the suction unit.

There is thus provided in accordance with another preferred embodiment of the present invention, apparatus for removal of particles from a surface, including:

a fluid delivery unit adapted to apply a fluid to the surface on which the particles are distributed, including particles having a dimension of less than approximately one micron, so as to coat the particles with the fluid, and a suction unit constructed to apply a suction force in a vicinity of the surface after applying the fluid so as to generate a horizontal flow velocity of the fluid of at least 100 m/s, thereby removing at least some of the particles have the dimension of less than approximately one micron.

There is thus provided in accordance with a preferred embodiment of the present invention, apparatus for removing a particle from a surface, including:

a fluid delivery unit adapted to apply a fluid to the surface so as to coat the particle with the fluid, a laser delivery unit adapted to apply a laser beam onto the surface such that absorption of the beam at the surface releases the particle substantially without causing the particle to explode, and a suction unit constructed to apply a suction force to the surface so as to remove the particle and the fluid from the surface.

The present invention will be more fully understood from the following detailed description of the preferred embodiments thereof, taken together with the drawings, in which:

BRIEF DESCRIPTION OF THE DRAWINGS

FIG. 1 is a simplified pictorial illustration of apparatus for removal of a particle from a solid-state surface, in accordance with a preferred embodiment of the present invention;

FIG. 2 shows further detail of the apparatus of FIG. 1, and illustrates schematically a regime of forces above the solid state surface;

FIG. 3 is a simplified flowchart of a method of removing a particle from a solid-state surface, in accordance with a preferred embodiment of the present invention.

DETAILED DESCRIPTION OF PREFERRED EMBODIMENTS

Figure 4:
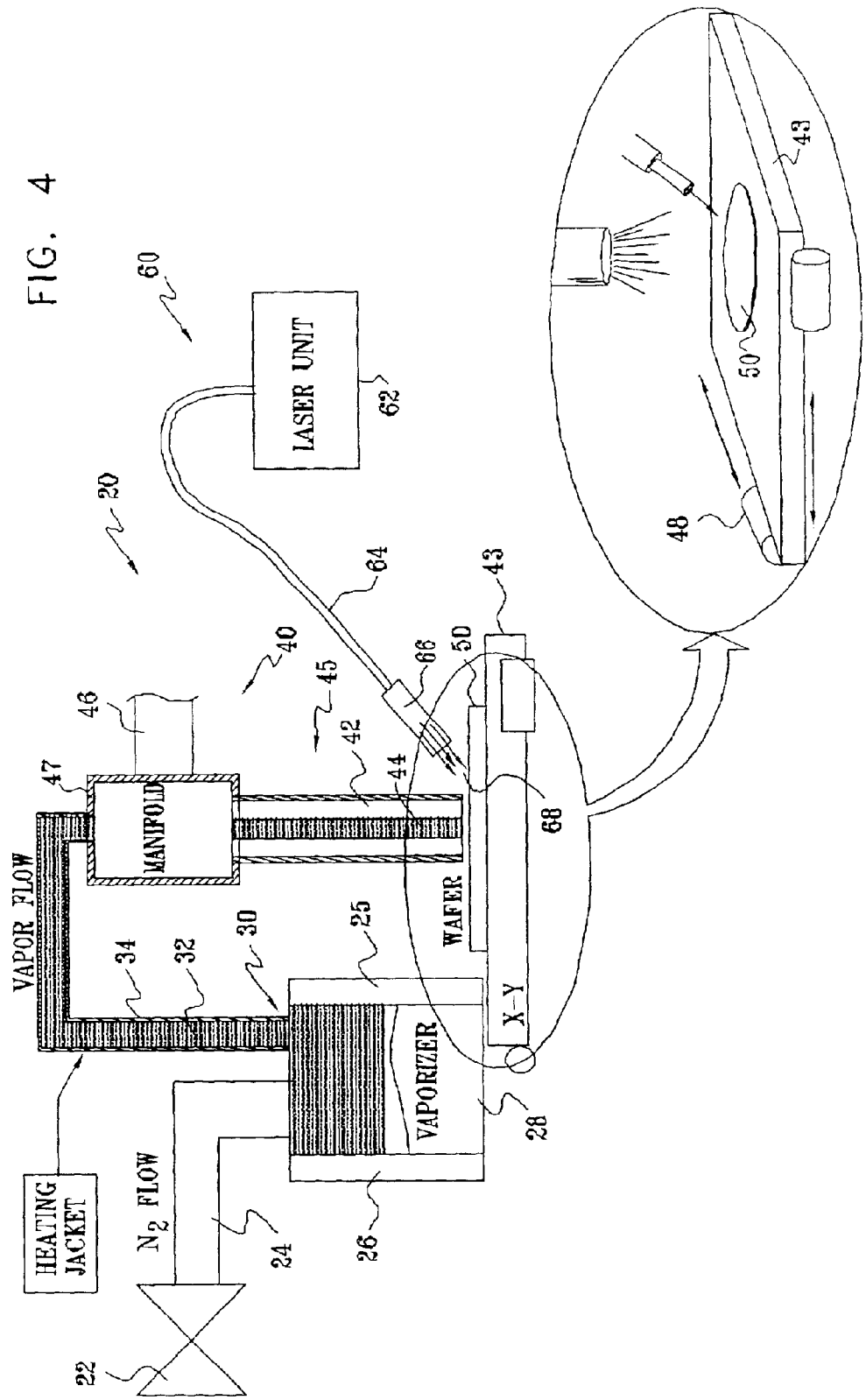
FIG. 4 is a simplified pictorial illustration of apparatus for removal of a particle from a solid-state surface incorporating a laser tool, in accordance with a preferred embodiment of the present invention.

FIG. 1 is a simplified pictorial illustration of a system 20 for removal of a particle from a solid-state surface 50, in accordance with a preferred embodiment of the present invention. The system for removing a particle from a solid-state surface typically comprises a fluid delivery unit 30 and a suction unit 40. The fluid delivery unit deposits a fluid, preferably a vapor, onto solid-state surface 50 so as to change the surface properties. The fluid delivery unit normally comprises a gas inlet valve 22, and a gas-conveying channel 24. This channel conveys nitrogen or an inert gas to a vaporizer chamber 28. The chamber is normally constructed with an external heating jacket 26 and a liquid entry channel (not shown). The liquid may be, for example, water, a solvent, or an aqueous solution. The liquid is heated, typically from 30–80° C., by jacket 26 so as to be partially or fully vaporized or to enter a gaseous phase. This phase or combination of liquid and/or vapor and/or gaseous phases is defined herein broadly as a fluid. The fluid may thus also comprise steam.

The fluid is conveyed from vaporizer 28 via a fluid channel 32 and further via a fluid delivery channel 44 to solid surface 50. Channel 32 is typically heated externally by a heating jacket 34 or other means known in the art. Typically, vaporizer 28 comprises a heating element 25, which is configured to transfer heat to heating jackets 26 and 34. Preferably, heating jacket 34 is extended so as to heat fluid delivery channel 44 and a suction channel 42 concomitantly. Fluid delivery channel 44 may deliver the fluid as a vapor or a liquid-phase spray.

Suction unit 40 typically comprises a vacuum or displacement pump (not shown) which introduces reduced pressure or vacuum forces to a channel 46. The channel may be under continuous or non-continuous suction. It has been found experimentally, that non-continuous suction is more effective than continuous suction (see examples hereinbelow). The suction is controlled by the activation of a valve 48 leading to channel 46. Channel 46 leads to a nozzle assembly 45. Nozzle assembly 45 typically comprises two channels. Nozzle assembly 45 is connected to fluid delivery unit 30 via a manifold assembly 47, as is known in the art. Typically, the manifold assembly may incorporate a micrometer (not shown), which controls the height of assembly 45 above wafer 50. Fluid delivery channel 44, typically the inner channel, conveys the fluid phase to surface 50. Suction channel 42, typically an outer annular channel, conveys particles and fluid from the surface under suction forces. Alternatively, suction channel 42 and fluid delivery channel 44 can each be mounted on a separate nozzle assembly 45, so as to operate system 20 with two independent nozzle assemblies.

An alternative configuration to nozzle assembly 45 in system 20 is to provide a matrix of fluid delivery channels 44 and suction channels 42 (not shown). This alternative design enables a faster and more efficient scanning of surface 50 by system 20. The alternative design also enables use of pulsed suction in one or more suction channels 42 concomitantly. This, in turn, enables substantial elimination of boundary layer phenomena at one or more areas of surface 50.

Surface 50 is typically that of a semiconductor wafer, a photolithography mask, an extreme UV mask, a flat panel display, or may be a solid state surface of another type. The wafer is typically supported on an x-y stage 43 with the fluid delivery and suction channels 44, 42 controlled to reach any coordinate on the x-y stage. Alternately, the stage may be a rotating stage, and the channels may be operated to reach any point by moving on a theta axis. Further alternatively, stage 43 may be static and one or more nozzle assemblies 45 may be moved above surface 50. Stage 43 may also be integrated into an inspection tool such as a Tencor 7200 system (KLA-Tencor, San Jose, Calif.), an "Excite" inspection tool (Applied Materials, Santa Clara, Calif.), or any other inspection system known in the art.

Generally, liquid vapor condenses on particles on the wafer surface such that the overall size of any given particle with the liquid around it is much larger than it was before. System 20 described herein has been shown to operate effectively for the removal of many types of contaminants including, but not limited to, latex, silicon nitride, silica, aluminum, and dust. The introduction of the liquid onto the particle, coupled with a turbulent mass-transfer regime surrounding the particle induced by a suction force from suction unit 40, introduces a mechanical shock to the particle. The mechanical shock, coupled with the dissolution forces of the particle into the liquid phase, tends to release the particle from the surface. The suction force enables the particle and the liquid to be removed from the surface.

FIG. 2 shows further detail of the apparatus of FIG. 1, and illustrates schematically the regime of forces above the solid state surface. The system is typically constructed such that the fluid is delivered in a channel, such as channel 44 (FIG. 1) and the suction forces remove the particle and fluid in another channel (channel 42, shown in FIG. 1). The channels are typically constructed to be perpendicular to the solid-state surface so as to deliver the fluid perpendicularly (normally) onto the surface and likewise to exert the suction force in the normal direction. Alternatively, the channels may be adjusted to a tilt angle of up to around 40 degrees from the perpendicular. More preferably, the channels may be tilted at 30 from the perpendicular.

A preferable design of the channel is with inner channel 44 delivering the fluid and outer annular channel 42 comprising a narrow gap between the inner and outer wall of the annulus. Preferably, the outer channel has a narrow gap of less than 1 mm, more preferably of around 0.1 to 0.3 mm, and most preferably 0.3 mm.

Flow regimes in and around a nozzle 56 at the end of channels 42 and 44 are highly turbulent. The horizontal fluid velocity, shown diagrammatically as arrows 52 underneath nozzle 56 and above and parallel to surface 50, is typically around 300 m/s. The fluid velocity in the nozzle designated by arrows 54 is around 80 m/s. A lower edge of nozzle 56 of channels 42 and 44 is placed approximately 0.1–0.5 mm above solid-state surface 50, and most preferably about 0.2 mm above the solid-state surface. The flow regime above surface 50 substantially reduces or eliminates boundary layer phenomena, stagnation and laminar flow phenomena.

An operational additional alternative is to perform dry suction (without prior wetting) via one or more suction channels 42, followed by a wet suction operation to remove residual contaminants that were not removed by the dry suction or which resettled on the surface.

In some aspects of one of the preferred embodiments, system 20 may be integrated into a laser cleaning tool such as a Bee tool, produced by Applied Materials (Yokneam, Israel). The tool is typically configured to apply laser energy to the particle so as to aid the release of the particle from the surface (see FIG. 4 below). In such applications, the fluid coating has the additional advantage of preventing the explosion of contaminant particles due to absorption of the laser radiation. Such explosion can cause the contaminant to "splash" over the wafer surface, leaving deposits that are difficult or impossible to remove (see Example 3 below).

In some other preferred embodiments of the present invention, system 20 may be integrated with an inspection tool, for detecting contaminants on surface 50 before and after cleaning. Such integration is described, for example, in PCT patent application no. PCT/IL99/00701, whose disclosure is incorporated herein by reference.

FIG. 3 is a simplified flowchart of a method of removing a particle from a solid-state surface, in accordance with a preferred embodiment of the present invention.

In a particle-coating step 100, a fluid phase is delivered onto surface 50 (FIG. 1). The surface may be totally, locally, or partially coated in a fluid film. The typical thickness of this film is up to 50 microns, but more preferably 0.5 to 10 microns. The fluid phase is typically heated to 30–80° C. When the heated fluid impacts on the solid-state surface, some or all of the fluid molecules condense on the surface. The surface is thus coated with a warm film of liquid. The heat of the film also effects dissolution of a particle into the liquid phase according to Arrhenian kinetics.

The wafer is typically supported on x-y 43 stage with the fluid delivery and suction channels controlled to reach any coordinate on the x-y stage. Alternatively, the stage may be a rotating stage, and the channels may be operated to reach any point by moving on a theta axis (see FIG. 4 below).

In some regimes of the method of the present invention, the fluid phase flow is halted. Thereafter there is a waiting step 150, in which there is no fluid phase flow and no suction. This lag or waiting step is normally 0–2 seconds, and more preferably 0.2 seconds. This has been found experimentally to be the most effective regime for particle removal.

Following waiting step 150, a pump is activated in a suction step 200. Suction is typically applied for 0–10 seconds. More preferably, the suction force is applied for around one second. Most preferably, the suction force is applied approximately 0.2 seconds after the fluid phase flow has been halted. It has been found experimentally that this regime provides the most efficient, non-destructive particle removal. The particles removed by this method are typically up to 100 microns in diameter, including particles in the range below 10 microns in diameter, and optimally as small as around 0.1 microns in diameter.

The wet suction technique described herein can be employed in a stand-alone system, independent of any additional process steps or other cleaning methods. Alternatively, it can be integrated into a process tool, such as a chemical mechanical polishing (CMP) tool. An additional alternative is to integrate it into a laser cleaning tool.

System 20 described herein is suitable for application to full wafer surface cleaning or to local treatment of selected areas on the wafer. Local treatment may be preceded by inspection (as in the above-mentioned Bee tool) in order to identify regions that must be cleaned. Alternatively, specific, sensitive parts of surface 50 may be designated in advance for cleaning, without the use of a pre-inspection tool or process.

FIG. 4 is a simplified pictorial illustration of apparatus for removal of a particle from a solid-state surface incorporating a laser tool, in accordance with a preferred embodiment of the present invention. FIG. 4 shows system 20 of FIG. 1 with a laser cleaning unit 60, comprising a laser generating module 62, a laser delivery channel 64 and a laser delivery head 66 delivering a laser beam 68. Module 62 typically comprises an IR laser of 2.94 micron wavelength. Module 62 may employ any type of laser known in the art, such as an excimer type laser.

Generally, system 20 is operated as described hereinabove in FIG. 3, and the laser unit is activated after step 100. An example of the working conditions is provided in Example 3 below. Typically, the laser is applied prior to the suction force being activated. Surface 50 is moved on x-y stage 43 by means of a motorized mechanism 48 such that the laser beam can be directed to any point on the stage or wafer. The laser beam can be applied to the whole of surface 50. Alternatively, it may be directed according to the coordinates of a particle detected on surface 50 by an inspection tool (not shown).

The application of system 20 is exemplified by, but not limited to the following examples.

EXAMPLE 1

System 20 of FIGS. 1 and 2 was used to effect particle removal from a wafer surface. Channel 42 had a diameter of ⅛ inch and channel 44 had a diameter of ¼ inch. The channels were set perpendicularly with a distance from nozzle 56 of around 0.2 mm above the wafer surface 50. The vaporizer temperature was set at 40° C. and the outer channel 44 temperature was set at 80° C. Nitrogen flow was set a 0.5 lpm (liters per minute). The process sequence was coating step 100 (FIG. 3) of 0.8 s, waiting step 150 of 0.2 s, followed by 1 s of suction step 200. Silicon wafers having 0.5 micron aluminum particles, or 0.4 micron silicon nitride particle contaminants were used.

The presence of particles before and after the particle removal process of system 20 was monitored in a Tencor 7200 system (KLA-Tencor, San Jose, Calif., USA). The results for mapped aluminum particles and silicon nitride particles are shown in Table 1.

TABLE 1

Removal results for mapped particles.

| Particle Type | No. of particles | Percent removal by system 20 |
|---|---|---|
| Aluminum 0.5 um | 90 | 88% |
| Aluminum 0.5 um | 93 | 87% |
| $Si_3N_4$ 0.4 um | 67 | 81% |

A Tencor 7200 inspection system was used to inspect the substrate surface. It was noted that approximately 90% of the aluminum and silicon nitride particles were removed (Table 1).

EXAMPLE 2

System 20 of FIGS. 1 and 2 was used to effect particle removal from a wafer surface. Channel 42 had a diameter of ⅛ inch and channel 44 had a diameter of ¼ inch. The channels were set perpendicularly with a distance from nozzle 56 of around 0.2 mm above the wafer surface 50. The vaporizer temperature was set at 40° C. and the outer channel 44 temperature was set at 80° C. Nitrogen flow was set at 0.5 lpm (liters per minute) The process sequence was coating step 100 (FIG. 3) of 0.8 s, waiting step 150 of 0.2 s, followed by 1 s of suction step 200.

The presence of airborne particles was analyzed within a representative field of view using an in-situ CCD monitor. The number of particles removed by narrow gap suction with and without the fluid phase was determined. The results are displayed in Table 2.

TABLE 2

Removal results for airborne particles.

| Size [um] | No. of particles | Removed by vapor-enhanced Narrow gap suction (NGS) | Removed by NGS without vapor enhancement |
|---|---|---|---|
| 1–10 | 14 | 86% | 92% |
| 0.5–1 | 20 | 90% | 10% |
| 0.2–0.5 | 40 | 70% | 0% |

It can be seen from Table 2, that the vapor had an ameliorative effect on the particle removal efficiency, the effect increasing with decreasing particle size. It may be understood from these examples that vapor-enhanced narrow gap suction has much potential for removal of small particles (less than 1 micron diameter) for use in non-laser cleaning tools or tools employing other techniques.

EXAMPLE 3

A Laser Bee Tool (Applied Materials, Yokneam, Israel) was set up in conjunction with system 20 of FIG. 1. The system parameters were as listed in Table 3.

TABLE 3

Process parameters

| Parameter | Value |
|---|---|
| Compact humidifier on the process head | |
| Narrow nozzle | 0.3 mm |
| IR laser wavelength [micron] | 2.94 μm |
| Beamline | Optical Parametric Oscillator (OPO) + laser |
| Laser spot size | 1.6 mm × 2.6 mm. |
| Humidifier temp. [C.] | 30° |
| Gas pipe temp. [C.] | 60° |
| Flow [slpm] | 0.5 |
| Laser Fluence [mj/cm$^2$] | ~1100 for 0 attenuators ~700 for 2 attenuators ~300 for 4 attenuators |
| Number of pulses | 3 |
| Humidifier valve open [sec] | 0 |
| Humidifier valve open duration [sec] | 0.1 (1 for heavy wetting) |
| Laser delay time [sec] | 0.1 (1 for heavy wetting) |
| Suction open [sec] | 0.1 (1 for heavy wetting) |
| Suction duration [sec] | 0.5 (or longer) |
| Max number of Iterations | 10 |

It was found that using a dry laser process, more than 80% of the particles exploded, and were therefore left on the wafer. When the vapor-enhanced narrow-gap method was performed with a coating time of 0.5 s, however, none of the silicon nitride particles exploded, and all were removed (100% removal). A similar trend was observed for alumina particles. It may be understood from this example that vapor-enhanced processing alleviates particle explosion in laser cleaning tools.

It will be appreciated by persons skilled in the art that the present invention is not limited to what has been particularly shown and described hereinabove. Rather, the scope of the present invention includes both combinations and subcombinations of the various features described hereinabove, as well as variations and modifications thereof that are not in the prior art, which would occur to persons skilled in the art upon reading the foregoing description.

What is claimed is:

1. A method for removing particles from a surface, comprising:
   heating a fluid to form a vapor;
   applying the vapor to the surface so as to condense the vapor on the particles and coat the particles on the surface with a liquid; and
   applying a suction force after applying the vapor so as to remove from the surface a majority of the particles that have a dimension of less than approximately one micron.

2. A method according to claim 1, wherein the fluid comprises water.

3. A method according to claim 1, wherein applying the fluid comprises using a carrier gas to convey the fluid to the surface.

4. A method according to claim 1, wherein heating the fluid comprises heating the fluid to 30–80° C.

5. A method according to claim 1, wherein applying the suction force comprises waiting for a predetermined time period following applying the fluid before applying the suction force.

6. A method according to claim 5, wherein the time period is in the range of 0.01 to 2 seconds.

7. A method according to claim 1, wherein applying the fluid comprises applying the fluid through a channel held approximately perpendicularly to the surface.

8. A method according to claim 7, wherein applying the suction force comprises applying the suction force through an annular channel surrounding the channel through which the fluid is applied.

9. A method according to claim 8, wherein applying the suction force further comprises heating the annular channel and the fluid delivery channel.

10. A method according to claim 1, wherein applying the suction force comprises applying the suction force through a channel held at a tilt of 1–40 degrees from a perpendicular angle to the surface.

11. A method according to claim 1, wherein applying the suction comprises applying the suction so as to generate a turbulent flow regime at the surface.

12. A method according to claim 1, and wherein applying the suction force comprises applying the suction force for a period of time between 0.1 and 10 seconds.

13. A method according to claim 1, wherein at least some of the particles removed have a dimension less than 0.2 micron.

14. A method according to claim 1, wherein applying the suction comprises removing the particles via a nozzle having an aperture of less than 10 mm.

15. A method according to claim 14, wherein the aperture is between 0.5 and 5 mm.

16. A method according to claim 14, wherein the nozzle is placed approximately 0.1–0.5 mm above the surface.

17. A method according to claim 1, wherein the surface is the surface of a semiconductor wafer.

18. A method for removing particles from a surface, comprising:
heating a fluid to form a vapor;
applying the vapor to the surface on which the particles are distributed so as to condense the vapor on the particles and coat the particles with a liquid; and
applying a suction force in a vicinity of the surface after applying the fluid vapor so as to generate a horizontal flow velocity of the fluid of at least 100 m/s, thereby removing at least some of the particles.

19. A method according to claim 18, wherein the fluid comprises water.

20. A method according to claim 18, wherein applying the fluid comprises using a carrier gas to convey the fluid to the surface.

21. A method according to claim 18, wherein heating the fluid comprises heating the fluid to 30–80° C.

22. A method according to claim 18, wherein applying the suction force comprises waiting for a predetermined time period following applying the fluid before applying the suction force.

23. A method according to claim 22, wherein the time period is in the range of 0.01 to 2 seconds.

24. A method according to claim 18, wherein applying the fluid comprises applying the fluid through a channel held approximately perpendicularly to the surface.

25. A method according to claim 24, wherein applying the suction force comprises applying the suction force through an annular channel surrounding the channel through which the fluid is applied.

26. A method according to claim 25, wherein applying the suction force further comprises heating the annular channel and the fluid delivery channel.

27. A method according to claim 18, wherein applying the suction force comprises applying the suction force through a channel held at a tilt of 1–40 degrees from a perpendicular angle to the surface.

28. A method according to claim 18, wherein applying the suction comprises applying the suction so as to generate a turbulent flow regime at the surface.

29. A method according to claim 18, and wherein applying the suction force comprises applying the suction force for a period of time between 0.1 and 10 seconds.

30. A method according to claim 18, wherein at least some of the particles removed have a dimension less than 1 micron.

31. A method according to claim 18, wherein applying the suction comprises removing the particles via a nozzle having an aperture of less than 10 mm.

32. A method according to claim 31, wherein the aperture is between 0.5 and 5 mm.

33. A method according to claim 31, wherein the nozzle is placed approximately 0.1–0.5 mm above the surface.

34. A method according to claim 18, wherein the surface is the surface of a semiconductor wafer.

35. A method for removing particles from a surface, comprising:
heating a fluid to form a vapor;
applying the vapor to the surface so as to condense the vapor on the particles and coat the particles on the surface with a liquid; and
applying a suction force after applying the vapor so as to generate a horizontal flow velocity of the fluid of at least 100 m/s, thereby removing at least some of the particles that have a dimension of less than approximately one micron.

36. A method according to claim 35, wherein the fluid comprises water.

37. A method according to claim 35, wherein applying the fluid comprises applying the fluid through a channel held approximately perpendicularly to the surface.

38. A method according to claim 37, wherein applying the suction force comprises applying the suction force through an annular channel surrounding the channel through which the fluid is applied.

39. A method according to claim 38, wherein applying the suction force further comprises heating the annular channel and the fluid delivery channel.

40. A method according to claim 35, wherein the horizontal flow velocity is in a range of a speed of sound.

41. A method of removing a particle from a surface, comprising:
heating a fluid to form a vapor;
applying the vapor to the surface so as to condense the vapor on the particle and coat the particle with a liquid;
applying a laser beam to the surface such that absorption of the beam at the surface releases the coated particle from the surface substantially without causing the particle to explode;
and
removing the released particle and the liquid from the surface by means of a suction force.

42. A method according to claim 41, wherein the fluid comprises water.

43. A method according to removing the released particle comprises applying a suction force in a vicinity of the surface after applying the fluid so as to generate a horizontal flow velocity of the fluid of at least 100 m/s, thereby removing the released particle and the fluid from the surface.

* * * * *